United States Patent
Deshpande et al.

(10) Patent No.: US 7,091,081 B2
(45) Date of Patent: Aug. 15, 2006

(54) METHOD FOR PATTERNING A SEMICONDUCTOR REGION

(75) Inventors: Sadanand V. Deshpande, Fishkill, NY (US); Rajiv M. Ranade, Fishkill, NY (US); George K. Worth, Gardiner, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 10/709,673

(22) Filed: May 21, 2004

(65) Prior Publication Data

US 2005/0260859 A1    Nov. 24, 2005

(51) Int. Cl.
*H01L 21/8238* (2006.01)

(52) U.S. Cl. .................. 438/230; 438/595; 438/618

(58) Field of Classification Search ................. 438/230, 438/303, 366, 595, 618, 958
See application file for complete search history.

(56) References Cited

U.S. PATENT DOCUMENTS

| | | | |
|---|---|---|---|
| 4,069,096 A | 1/1978 | Reinberg et al. | |
| 4,310,380 A | 1/1982 | Flamm et al. | |
| 4,741,799 A | 5/1988 | Chen et al. | |
| 5,790,354 A * | 8/1998 | Hause et al. | 438/305 |
| 2003/0018096 A1* | 1/2003 | Nallan et al. | 438/3 |
| 2003/0211684 A1 | 11/2003 | Guo | |

* cited by examiner

*Primary Examiner*—Phuc T. Dang
(74) *Attorney, Agent, or Firm*—James J. Cioffi; Daryl K. Neff

(57) ABSTRACT

A method is provided for patterning a semiconductor region, which can be heavily doped. A patterned mask is provided above the semiconductor region. A portion of the semiconductor region exposed by the patterned mask is etched in an environment including a polymerizing fluorocarbon, e.g., a chlorine-free fluorocarbon having a high ratio of carbon to fluorine atoms, and at least one non-polymerizing substance selected from the group consisting of non-polymerizing fluorocarbons, e.g. those having a low ratio of carbon to fluorine atoms, and hydrogenated fluorocarbons. The method preferably passivates the sidewalls of the patterned semiconductor region, such that a lower region of semiconductor material below the patterned region can be directionally etched without eroding the thus passivated patterned region.

30 Claims, 2 Drawing Sheets

METHOD FOR PATTERNING A SEMICONDUCTOR REGION

BACKGROUND OF INVENTION

The present invention relates to the processing of semiconductors, as, for example, in the fabrication of microelectronic devices and other micro-scale and nano-scale structures.

The patterning of semiconductor materials through etching is performed almost universally in the fabrication of microelectronic circuits and devices, as well as certain semiconductor elements and substrates used to interconnect microelectronic devices. The constant demand on the microelectronics industry to increase the speed and density of integrated circuits require that the dimensions of at least some microelectronic devices be reduced from one generation to the next.

However, as device sizes are reduced, difficulties are encountered in maintaining new device dimensions within tolerances. This is especially true of the critical dimension of a device. In integrated circuits, the critical dimension represents the smallest size of certain features, such as an element of a transistor. For example, the width of the gate conductor of a field effect transistor (FET) of an integrated circuit is generally fabricated to the critical dimension. Other features of a FET, such as the source and drain, may also need to be fabricated at the critical dimension. As these device elements are reduced in size, the difficulty of patterning them increases. The challenges of etching semiconductor materials to the correct physical dimensions is a growing concern.

The formation of gate conductors of FETs poses particular challenges. In some processes, a layer of intrinsic polysilicon, or at most lightly doped polysilicon, is deposited to a thickness of about 1500 Å on a gate dielectric. Thereafter, heavily doped p+ and n+ regions are formed in the uppermost 250 Å to 500 Å thickness of the layer by implanting dopants of respective types (e.g., boron as a p+ dopant, and phosphorous as an n+ dopant) in separate masked implantations. This results in a layered stack having a lower layer of intrinsic, or at most lightly doped, polysilicon and an upper layer of heavily doped polysilicon. The layered stack is then patterned by etching down to the gate dielectric to define the locations and widths of the gate conductors. Subsequent high temperature annealing then drives dopants from the upper polysilicon layer into the lower polysilicon layer to form p doped gate conductors of p-type FETs and n doped gate conductors of n-type FETs.

The patterning of the layered stack is performed efficiently when both the upper layer and the lower layer are patterned together by etching. However, heretofore, the patterning of a heavily doped polysilicon layer and an intrinsic or lightly doped polysilicon layer has posed difficulties for maintaining the critical dimension of the gate conductor.

FIG. 1 illustrates a problem of patterning both a heavily doped polysilicon layer and an essentially undoped layer according to the prior art. As illustrated in FIG. 1, an upper, heavily doped, polysilicon layer 37 (illustratively, n+ doped) is disposed above a lower, lightly doped (or not doped), lower polysilicon layer 39. In turn, the lower polysilicon layer 39 is disposed on a gate dielectric 30 (here, a gate oxide layer). In this example, the dopant concentration in the upper layer illustratively ranges from about $10^{18}$ cm$^{-3}$ to $10^{21}$ cm$^{-3}$, while the dopant concentration in the lower layer is typically below $10^{16}$ cm$^{-3}$, and more commonly below $10^{15}$ cm$^{-3}$. The lower polysilicon layer 39 is not required to have any dopants present.

Thus, the upper layer has a dopant concentration that is two or more orders of magnitude higher than that of the lower layer. The upper and lower layers 37, 39 are parts of a gate conductor stack. The upper and lower layers 37, 39 are shown here after etching by a conventional single-step anisotropic vertical etch process, such as any of several known classes of directional etching processes, e.g., a reactive ion etch (RIE). Illustratively, the gate dielectric is a gate oxide, such as provided by thermal growth from an uppermost device region (not shown) of a semiconductor substrate (not shown). The substrate is typically a bulk substrate or semiconductor-on-insulator type substrate having a device region including silicon and/or silicon germanium.

The developed patterns of a photoresist imaging layer are shown as layer 35, and layer 36 is an anti-reflective coating (ARC) or other hardmask material (hereinafter "ARC layer") that is patterned according to the image patterns in the photoresist layer. ARC layer 36 helps to transfer the photoresist image patterns to the polysilicon layers 37 and 39 underlying it.

In an exemplary etching process according to the prior art, component gases present in the etching chamber include $SF_6$, $NF_3$ or HBr or a mixture thereof. As apparent from FIG. 1, the sidewall of the upper layer 37 has eroded significantly, such that the sidewalls 38 of the upper layer 37 are not straight. Rather, the sidewalls 38 have been undercut underneath the ARC layer 36. As a result, the dimension 40 of the bottom surface 33 of the upper layer 37 has become smaller than the dimension 42 at the top surface 34. While the lower layer 39 is potentially subject to some erosion and undercutting during etching, this problem affects the upper layer 37 disproportionately, because of its much higher dopant concentration (by orders of magnitude). Other etching mixtures are also problematic. For example, when the etchant includes $NF_3$ mixed with a fluorocarbon having a low carbon to fluorine ratio (e.g. $CF_4$), results are detrimental to the photoresist mask 35. A mixture of CF4 and SF6 has also been tried for etching heavily doped polysilicon. However, this chemistry has resulted in severe etch depth non-uniformity within the wafer when etching heavily doped polysilicon, which can impact the integrity of the patterned structures.

The effect of the problem is experienced most when the lower layer of polysilicon 39 is etched. Since the eroded upper layer 37 has a smaller dimension 40 than desired, this smaller dimension 40 is transferred to the critical dimension 44 of the lower layer 39 during etching. As a result, the critical dimension 44 of the gate conductor in contact with the gate oxide 30 becomes smaller than the desired dimension 42. Stated another way, the erosion of the upper layer 37 prevents the desired dimension 42 of the patterned ARC layer 36 from being transferred faithfully to dimension 44 of the lower layer 39 where the lower layer meets the gate oxide 30.

Thus, a solution is needed for etching a region of heavily doped semiconductor material to produce a patterned region having straight sidewalls, which avoids substantial sidewall erosion and undercutting. Having produced a patterned region having straight sidewalls, a region of lightly doped semiconductor material lying below the patterned region could itself be patterned more reliably to an intended dimension.

SUMMARY OF INVENTION

According to an aspect of the invention, a method is provided for patterning a semiconductor region, such as a heavily doped semiconductor region. A patterned mask is provided above the semiconductor region. A portion of the semiconductor region exposed by the patterned mask is etched in an environment including a polymerizing fluorocarbon, e.g., a chlorine-free fluorocarbon having a high ratio of carbon to fluorine atoms, and at least one non-polymerizing substance selected from the group consisting of non-polymerizing fluorocarbons, e.g. those having a low ratio of carbon to fluorine atoms, and hydrogenated fluorocarbons. Preferably, the environment further includes nitrogen. The method preferably passivates the sidewalls of the patterned semiconductor region, such that a lower region of semiconductor material below the patterned region can be directionally etched without eroding the thus passivated patterned region.

According to a preferred aspect of the invention, the etching is performed anisotropically, in an essentially vertical direction, such that a pattern resulting from the etching has a substantially straight sidewall.

According to a further preferred aspect of the invention, the environment further includes a plasma, has a pressure ranging between about 2 milliTorr and about 100 milliTorr, and etching is performed at a wafer temperature between about 10° C. and 100° C.

According to a particular preferred aspect of the invention, the semiconductor region includes a first semiconductor layer disposed above a second semiconductor layer, the first semiconductor layer being heavily doped, and the second semiconductor layer being no more than lightly doped, wherein portions of the first and second semiconductor layers are patterned by the etching such that a resulting pattern has a substantially straight sidewall.

Preferably, at least portions of the semiconductor region patterned by the etching have polycrystalline form or amorphous form, and more preferably, are polycrystalline in form.

According to a preferred aspect of the invention, the patterned mask includes an anti-reflective coating (ARC). The patterned mask may further include a hardmask layer, e.g. an inorganic layer of oxide and/or nitride, disposed below the ARC and above the first semiconductor layer.

According to another aspect of the invention, a method is provided for patterning a semiconductor region. According to such aspect, a patterned mask is provided above the semiconductor region. A portion of the semiconductor region exposed by the patterned mask is etched in an environment including at least one substance selected from the group consisting of chlorine-free fluorocarbons having a high ratio of carbon to fluorine atoms, and at least one substance selected from the group consisting of: (a) fluorocarbons having a low ratio of ratio of carbon to fluorine atoms, and (b) hydrogenated fluorocarbons.

According to yet another aspect of the invention, a method is provided for patterning a layered stack including a first, essentially polycrystalline, semiconductor layer having a first dopant concentration and a second essentially polycrystalline semiconductor layer having a second dopant concentration, the first dopant concentration being greater than about 100 times the second dopant concentration. According to such method, a patterned mask is provided above the layered stack. A portion of the first semiconductor layer exposed by the patterned mask is then etched. A portion of the second semiconductor layer underlying the etched portion of the first semiconductor layer is etched, wherein the etching is performed in an environment including nitrogen, at least one substance selected from the group consisting of chlorine-free fluorocarbons having a high ratio of carbon to fluorine atoms, and at least one substance selected from the group consisting of a) fluorocarbons having a low ratio of ratio of carbon to fluorine atoms, and b) hydrogenated fluorocarbons.

DETAILED DESCRIPTION

It bears noting that while the embodiments of the invention are described in the context of etching of a gate stack including a heavily doped n+ or p+ layer of polysilicon, overlying a lightly doped polysilicon layer, the invention is not so limited. The principles of the invention described herein apply as well to the patterning of other material forms of semiconductors, i.e., amorphous and single-crystal semiconductors. Moreover, the principles of the invention apply not only to the etching of silicon, but to alloys of silicon as well, e.g., silicon germanium.

Embodiments of the invention are described herein with particular regard to improving the patterning of critically dimensioned elements. Hence, in the embodiments described below, methods are provided for patterning a semiconductor region so as to reduce the aforementioned erosion and undercutting of the upper semiconductor layer. In such manner, a gate stack having a lower layer of polysilicon and a more heavily doped upper layer of polysilicon can be patterned to the critical dimension within tolerances.

Figure 1:
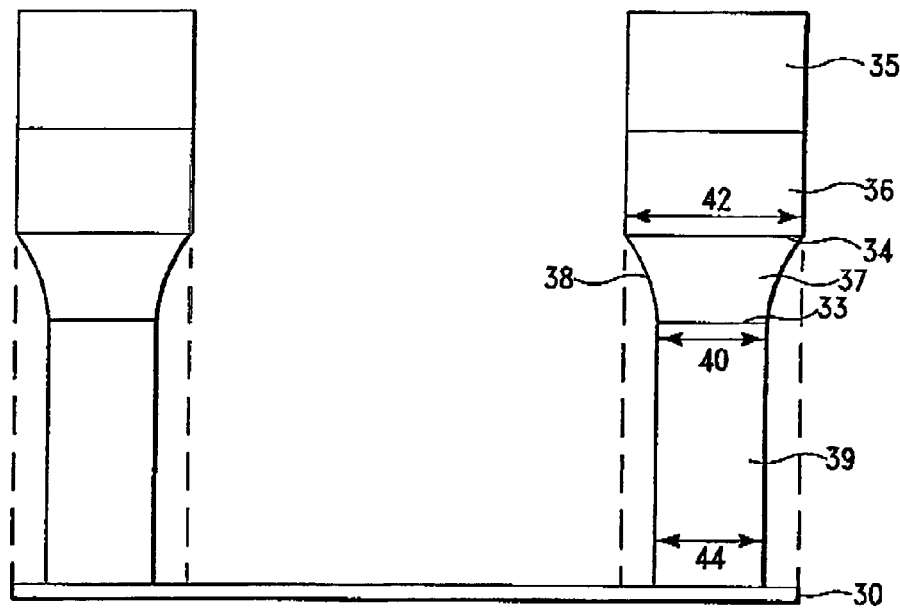
FIG. 1 is a cross-sectional diagram of a patterned gate stack structure, illustrating a problem encountered when etching a two-layer semiconductor gate stack according to a conventional process.
Figure 2:
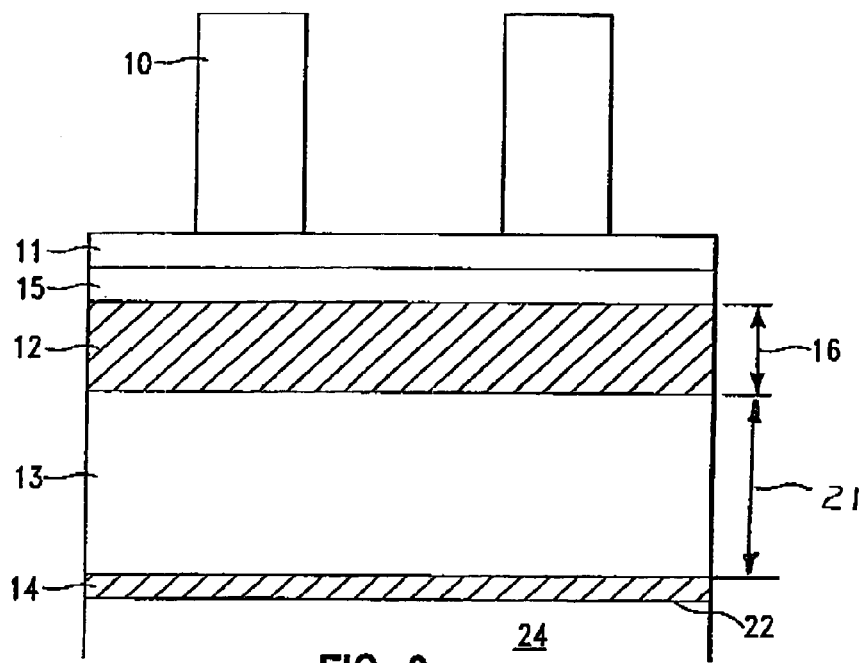
FIG. 2 is a cross-sectional diagram illustrating a preliminary stage in a process of etching a semiconductor gate stack according to an embodiment of the invention.

As shown and described herein, like elements are shown by like numerals throughout. FIG. 2 is a cross-sectional view illustrating a preliminary stage in a patterning process according to an embodiment of the invention. As shown in FIG. 2, a patterned photoresist layer 10 is provided, overlying a layered stack to be patterned, including an anti-reflective coating (ARC) II, a hardmask layer 15, an upper, heavily doped, polysilicon layer 13, having a dopant concentration, illustratively, of between about $10^{18} cm^{-3}$ and $10^{21} cm^{-3}$, and a lower, lightly doped or "undoped" polysilicon layer 13, having a dopant concentration of less than about $10^{16} cm^{-3}$, illustratively. At a critical dimension of 30 nm to 60 nm, such being the width of the photoresist pattern 10, the upper polysilicon layer 12 has a thickness 16 of about 50 nm. The lower polysilicon layer 13 can be an essentially "undoped" layer, which may or may not contain a slight dopant concentration. The lower polysilicon layer 13 can have a dopant concentration such as obtained by depositing polysilicon without intentionally doping the material. Alternatively, that layer 13 can be a lightly doped layer, typically having a dopant concentration that is two or more orders of magnitude lower than the dopant concentration of the upper layer 12. The lower polysilicon layer 13 has a thickness 21 of between about 50 nm and 100 nm.

The lower polysilicon layer 13 overlies a gate oxide 14, which is disposed on a major surface 22 of a semiconductor substrate 24. As described above, the ARC layer 11 assists in transferring the image from the patterned photoresist layer 10 to the polysilicon layers 12, 13 below. The hard mask layer 15 is optional. When present, the hard mask layer 15, typically an oxide such as silicon dioxide or alternatively, a nitride such as silicon nitride, is used to further help in transferring the image. Alternatively, the ARC layer 11 can be omitted and only the hard mask layer 15 used to assist with the image transfer.

The conditions under which it is desirable to use the hard mask layer 15 with the ARC layer 11, or instead of the ARC layer 11, and the reasons therefor, are beyond the scope of the invention described herein, and will not be discussed further. In the following description, it is assumed that a patterned mask having one more layers (e.g., a patterned photoresist layer, an ARC layer and/or a hardmask layer) exists which assists in transferring the developed photoresist pattern image to the upper and lower polysilicon layers.

Figure 3:
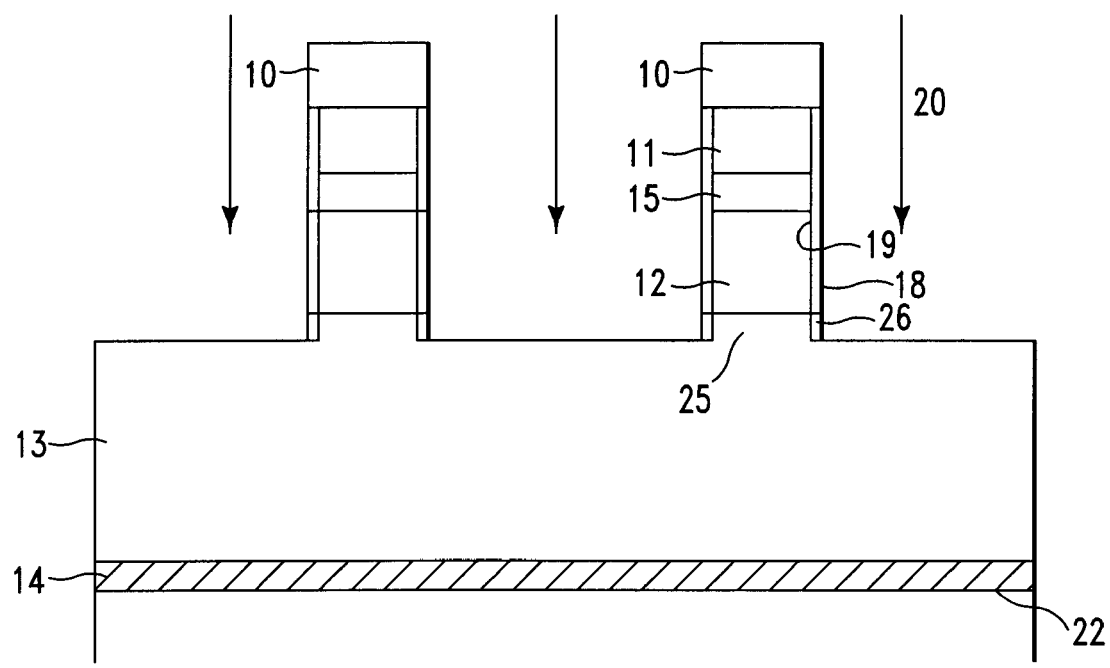
FIG. 3 is a cross-sectional diagram illustrating a stage subsequent to that shown in FIG. 2, of a process of etching a semiconductor gate stack according to an embodiment of the invention.

FIG. 3 is a cross-sectional diagram illustrating a subsequent stage in an etching process according to this embodiment of the invention. FIG. 3 shows a stage in the process after the upper polysilicon layer 12 has been etched. As shown in FIG. 3, the polysilicon layer does not exhibit excessive undercutting and erosion. Instead, as a result of the etch process, a passivation layer 18 has formed on a sidewall of the upper polysilicon layer 12 and the overlying ARC layer 11 and hard mask layer 15, which protects the upper polysilicon layer.

The etching conditions which are conducive to etching the upper and lower polysilicon layers 12, 13 while forming such passivation layer 18 will now be described. The etching process is a reactive ion etch process, anisotropic and directional in nature, which proceeds principally in a first direction 20. The first direction 20 is typically perpendicular to the major surface 22 of the substrate 24, or otherwise substantially perpendicular. The principal direction of etching is determined by the orientation of a source of ions (not shown) used in the etching process to the major surface 22 of the substrate. Thus, while the etching proceeds principally in one direction, such direction can be varied from the perpendicular by varying the orientation of the ion source to the major surface 22, when desired according to the needs of the particular fabrication process.

The etching process is desirably conducted at a relatively low wafer (substrate) temperature of 10° C. to 100° C., and at low-pressure, for example, between about 2 milliTorr and 100 milliTorr, using dual radio frequency (RF) plasma generation sources. A first RF source, operating at 60 MHz, is used to dissociate component gases into ions and neutral particles. A second RF source at 13.56 MHz is used to impart directionality, i.e., anisotropy, to the etch process.

In this etching process, the component substances present in the etching chamber differ from those conventionally used to perform directional reactive ion etching of semiconductor materials. This etching process includes component substances, that result in the formation of a passivation layer 18 on sidewalls 19 of the upper polysilicon layer 12 as a byproduct of the etching process. The passivation layer 18 serves to protect the heavily doped upper polysilicon layer 12 from erosion and undercutting during subsequent processing. Thus, the passivation layer 18 serves to protect the upper layer 12 from subsequent erosion when the lower layer 13 is etched, even if the lower layer is etched in an environment including different component substances which would ordinarily erode the sidewalls of heavily doped polysilicon. The passivation layer includes a carbon-containing polymer and is typically very thin, having a thickness, illustratively, of 10 Å or less. Such passivation layer forms as an overlayer deposited onto the sidewall 19 of the upper polysilicon layer 12, and/or is somewhat embedded into the sidewall 19 of the upper layer 12.

In this etching process, etching is conducted using a polymerizing fluorocarbon, and at least one non-polymerizing substance. Exemplary polymerizing fluorocarbons include chlorine-free compounds that have a high ratio of carbon to fluorine atoms. The fluorocarbons $C_4F_8$, $C_5F_8$ and $C_4F_6$ fall into this category. Such fluorocarbons are typically gaseous in form at the temperatures (e.g. 10° C. to 100° C.) and pressures (generally between about 2 milliTorr to 100 milliTorr) that are normally present during the etching process.

The non-polymerizing substance is typically a non-polymerizing fluorocarbon and/or a hydrogenated fluorocarbon. Among non-polymerizing fluorocarbons are those that have a low ratio of carbon atoms to fluorine atoms, such as $CF_4$, for example. Alternatively, a hydrogenated fluorocarbon such as $CH_2F_2$, or $CHF_3$ can take the place of, and fulfill the same function, as the non-polymerizing fluorocarbon.

In addition to the polymerizing fluorocarbon and non-polymerizing fluorocarbon, nitrogen is also preferably present in the chamber. Nitrogen is helpful in providing a reasonably high rate of etching the upper polysilicon layer 12, and to regulate the deposition of the polymeric passivation layer 18 on the sidewall 19 of that layer 12. When the deposition of the passivation layer 18 during etching is controlled, the anisotropy of the etching process is maintained well, such that there is little or no undercutting of the upper polysilicon layer 12, and etching is performed with a substantially vertical etch profile.

Following the etching of the upper polysilicon layer 12, the lower polysilicon layer 13 is now available to be etched. As shown in FIG. 3, some overetching is typically performed when patterning the upper polysilicon layer 12, such that a portion 25 of the lower polysilicon layer 13 is also etched in the process. Thus, passivation layer 18 extends downwardly to cover portions 26 of the sidewalls of layer 13, as well.

Now that the upper polysilicon layer 12 has been patterned, having a passivation layer 18 in place on sidewalls 26 thereof, an etching process can be employed that is tailored to high-rate etching of the lightly doped (or undoped) lower polysilicon layer 12, and tailored to maintaining the vertical etch profile of the lower polysilicon layer 12. As the passivation layer 18 protects the upper polysilicon layer 12 from excessive erosion and undercutting, an etching process can be employed such as the one employing $SF_6$, $NF_3$ or HBr or mixture thereof, as described above as background to the invention. The overlying patterned photoresist layer 10 is typically removed prior to etching the lower polysilicon layer 13.

Figure 4:
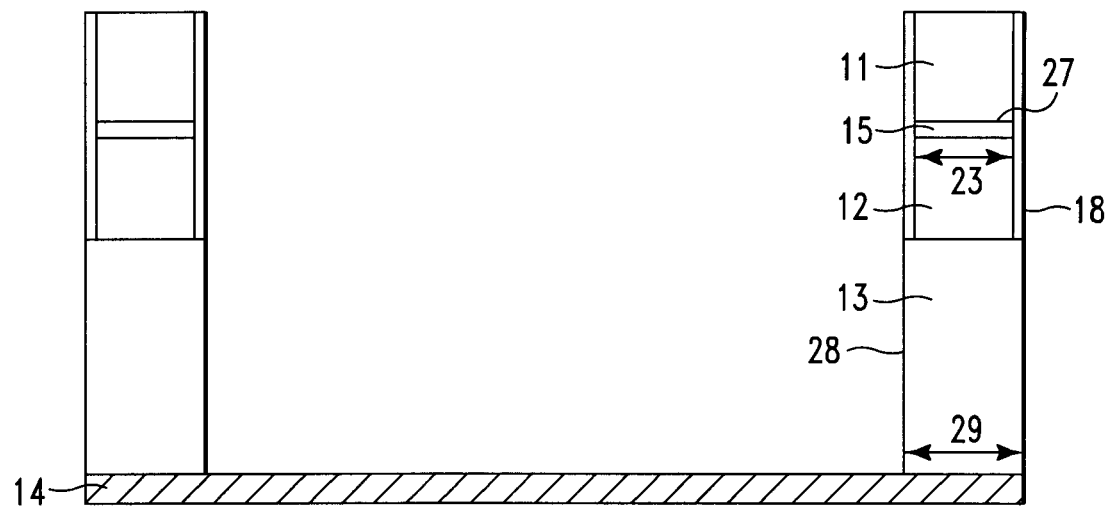
FIG. 4 is a cross-sectional diagram illustrating a still later stage in process of etching a semiconductor gate stack according to an embodiment of the invention, in which a lower semiconductor layer is etched, stopping at an underlying gate oxide layer.

Thereafter, with reference to FIG. 4, when the lower polysilicon layer 13 is etched by the conventional process, the passivation layer 18 remains in place to protect the upper polysilicon layer 12 from undercutting and erosion. Since the upper polysilicon layer 12 is patterned by the foregoing described process resulting in a passivation layer 18, the etching of the lower polysilicon layer 13 results in the etched layer having a substantially vertical sidewall 28. In such manner, the lower polysilicon layer 13 is patterned to a dimension 29 that is substantially the same as the dimension 23 at the upper surface 27 of the upper polysilicon layer 12.

In a variation of the above-described embodiment, the etching process used to pattern the upper polysilicon layer is continued such that the lower polysilicon layer is patterned by substantially the same etch process conditions as the upper polysilicon layer. In such case, the photoresist mask is consumed more quickly than it is be under the two-part etch process described above, such that the photoresist pattern must be provided to a sufficient minimum thickness at the start of etching. When process parameters are appropriately optimized, the lower layer is patterned through this one-part etch process to pattern gate conductors having a suitable vertical profile and within tolerances of the critical dimension.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of patterning a semiconductor region, comprising:
    providing a patterned mask above the semiconductor region; and
    etching a portion of the semiconductor region exposed by the patterned mask in an environment including a polymerizing fluorocarbon, and at least one non-polymerizing substance selected from the group consisting of non-polymerizing fluorocarbons and hydrogenated fluorocarbons.

2. A method as claimed in claim 1, wherein the etching is performed anisotropically.

3. A method as claimed in claim 2, wherein the etching is performed in an essentially vertical direction, such that a pattern resulting from the etching has a substantially straight sidewall.

4. A method as claimed in claim 1, wherein the environment further includes nitrogen.

5. A method as claimed in claim 1, wherein the polymerizing fluorocarbon includes at least one substance selected from the group consisting of chlorine-free fluorocarbons having a high ratio of carbon to fluorine atoms, and the non-polymerizing fluorocarbon is selected from the group consisting of fluorocarbons having a low ratio of carbon to fluorine atoms, the environment further including nitrogen.

6. A method as claimed in claim 5, wherein the environment further includes a plasma.

7. A method as claimed in claim 6, wherein the environment has a pressure ranging between about 2 milliTorr and about 100 milliTorr.

8. A method as claimed in claim 4, wherein the semiconductor region includes a first semiconductor layer disposed above a second semiconductor layer, the first semiconductor layer being heavily doped, and the second semiconductor layer being no more than lightly doped, wherein portions of the first and second semiconductor layers are patterned by the etching to have substantially straight sidewalls.

9. A method as claimed in claim 8, wherein at least portions of the semiconductor region patterned by the etching have at least one form selected from the group consisting of polycrystalline and amorphous.

10. A method as claimed in claim 9, wherein the portions patterned by the etching have polycrystalline form.

11. A method as claimed in claim 8, wherein the patterned mask includes an anti-reflective coating (ARC).

12. A method as claimed in claim 11, wherein the patterned mask includes a hardmask layer disposed below the ARC and above the first semiconductor layer.

13. A method as claimed in claim 12, wherein the hardmask layer includes an oxide.

14. A method of patterning a semiconductor region, comprising:
    providing a patterned mask above the semiconductor region; and
    etching a portion of the semiconductor region exposed by the patterned mask in an environment including at least one substance selected from the group consisting of chlorine-free fluorocarbons having a high ratio of carbon to fluorine atoms, and at least one substance selected from the group consisting of: (a) fluorocarbons having a low ratio of ratio of carbon to fluorine atoms, and (b) hydrogenated fluorocarbons.

15. A method as claimed in claim 14, wherein the etching is performed anisotropically.

16. A method as claimed in claim 15, wherein the etching is performed in an essentially vertical direction, such that a pattern resulting from the etching has a substantially straight sidewall.

17. A method as claimed in claim 16, wherein the environment further includes nitrogen.

18. A method as claimed in claim 17, wherein the environment further includes a plasma.

19. A method as claimed in claim 18, wherein the environment has a pressure ranging between about 2 milliTorr and about 100 milliTorr.

20. A method as claimed in claim 17, wherein the semiconductor region includes a first semiconductor layer disposed above a second semiconductor layer, the first semiconductor layer being heavily doped, and the second semiconductor layer being no more than lightly doped, wherein the etching patterns portions of the first and second semiconductor layers, such that a pattern resulting from the etching has a substantially straight sidewall.

21. A method as claimed in claim 20, wherein at least portions of the first and second semiconductor layers have a form selected from the group consisting of polycrystalline and amorphous.

22. A method as claimed in claim 21, wherein the portions patterned by the etching have polycrystalline form.

23. A method as claimed in claim 22, wherein the patterned mask includes an anti-reflective coating (ARC).

24. A method as claimed in claim 23, wherein the patterned mask includes a hardmask layer disposed below the ARC and above the first semiconductor layer.

25. A method as claimed in claim 24, wherein the hardmask layer includes an oxide.

26. A method of patterning a layered stack including a first essentially polycrystalline semiconductor layer having a first dopant concentration and a second essentially polycrystalline semiconductor layer having a second dopant concentration, the first dopant concentration being greater than about 100 times the second dopant concentration, the method comprising:
    providing a patterned mask above the layered stack; and
    etching a portion of the first semiconductor layer exposed by the patterned mask; and
    etching a portion of the second semiconductor layer underlying the etched portion of the first semiconductor layer, wherein the etching is performed in an environment including nitrogen, at least one substance selected from the group consisting of chlorine-free fluorocarbons having a high ratio of carbon to fluorine atoms, and at least one substance selected from the group consisting of fluorocarbons having a low ratio of ratio of carbon to fluorine atoms, and hydrogenated fluorocarbons.

27. A method as claimed in claim 26, wherein the etching is performed in an essentially vertical direction, such that a pattern resulting from the etching has a substantially straight sidewall.

28. A method as claimed in claim 27, wherein the patterned mask includes an anti-reflective coating (ARC).

29. A method as claimed in claim 28, wherein the patterned mask includes a hardmask layer disposed below the ARC and above the first semiconductor layer.

30. A method as claimed in claim 29, wherein the environment further includes a plasma.

* * * * *